United States Patent [19]
Dao et al.

[11] 4,140,920
[45] Feb. 20, 1979

[54] MULTIVALUED INTEGRATED INJECTION LOGIC CIRCUITRY AND METHOD

[75] Inventors: Tich T. Dao, Cupertino; Lewis K. Russell, San Jose; Edward J. McCluskey, Palo Alto, all of Calif.

[73] Assignee: Signetics Corporation, Sunnyvale, Calif.

[21] Appl. No.: 896,880

[22] Filed: Apr. 17, 1978

Related U.S. Application Data

[63] Continuation of Ser. No. 718,328, Aug. 27, 1976, abandoned.

[51] Int. Cl.$^2$ .................... H03K 19/08; H03K 19/20; G06F 7/50
[52] U.S. Cl. .................................. 307/207; 307/203; 307/209; 307/299 B; 307/351; 307/355; 328/158; 364/773
[58] Field of Search ............... 307/203, 207, 211, 215, 307/213, 209, 299 B, 355, 357, 351, 218; 328/158, 159; 364/768, 773; 357/92

[56] References Cited

U.S. PATENT DOCUMENTS

| | | | |
|---|---|---|---|
| 3,660,677 | 5/1972 | Maley et al. | 307/209 |
| 3,714,465 | 1/1973 | Skrenes | 307/357 |
| 3,816,758 | 6/1974 | Berger et al. | 357/92 X |
| 3,855,536 | 12/1974 | Neuner | 307/207 X |
| 3,916,218 | 10/1975 | Berger et al. | 307/215 X |
| 3,947,865 | 3/1976 | Russell | 307/215 X |
| 3,989,957 | 11/1976 | Tucci | 307/215 X |
| 4,081,822 | 3/1978 | Dao et al. | 307/299 B X |

OTHER PUBLICATIONS

Hart et al., "Bipolar LSI Takes a New Direction with Integrated Injection Logic", Electronics (pub.) pp. 111-118, 10/3/74.
Pedersen, "Integrated Injection Logic: A Bipolar LSI Technique", Computer (pub.), vol. 9, No. 2, pp. 24-29, 2/1976.
Blatt et al., "Substrate Fed Logic", IEEE-JSSC, vol. SC-10, No. 5, pp. 336-342, 10/1975.
Berger et al., "Merged-Transistor Logic (MTL)-A Low-Cost Bipolar Logic Concept", IEEE-JSSC, vol. SC-7, No. 5, pp. 340-346, 10/72.

*Primary Examiner*—Larry N. Anagnos
*Attorney, Agent, or Firm*—Jerry A. Dinardo; Jack Oisher

[57] ABSTRACT

Logic circuitry provides predetermined logic outputs in response to logical combinations of inputs. The circuitry includes a plurality of input devices for receiving logic inputs and capable of assuming conduction states in response to the logic levels of said inputs. At least one output device is connected to two or more input devices. Means having predetermined logic levels is provided connected intermediate the input and output devices for controlling the conduction state of the output devices as a function of the input devices and the predetermined logic levels.

12 Claims, 25 Drawing Figures

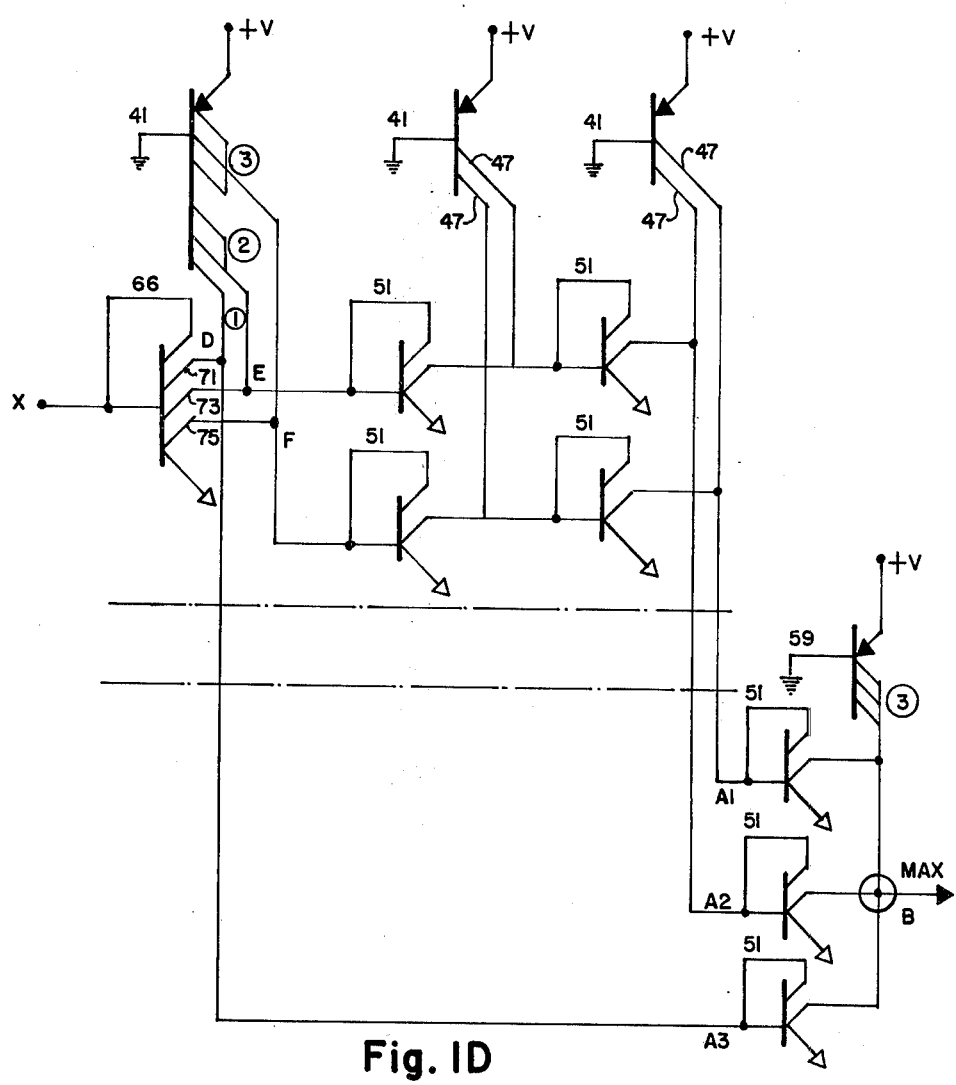
Fig. 1D
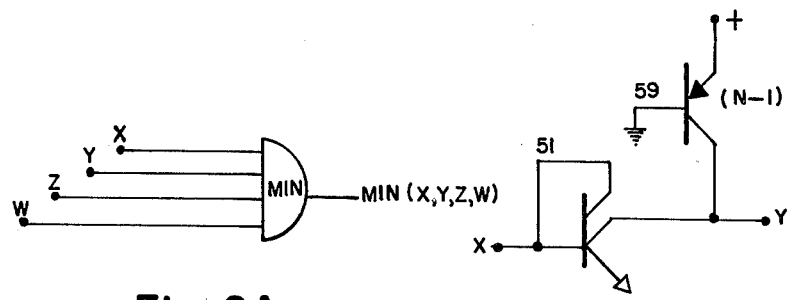
Fig. 2A
Fig. 2B

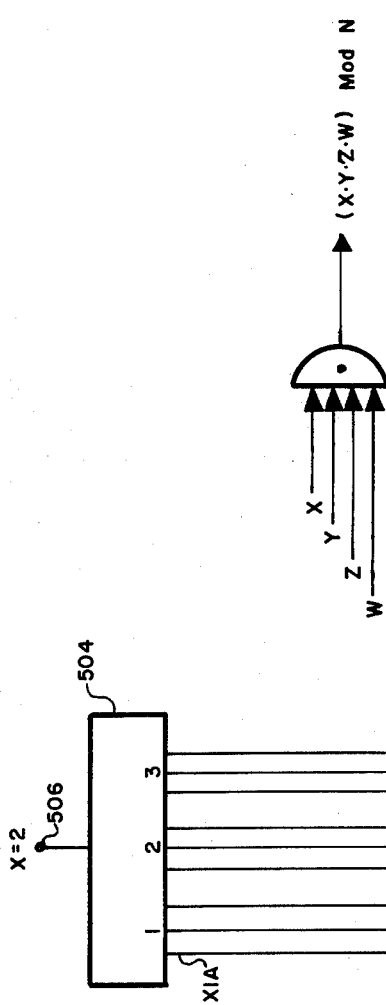
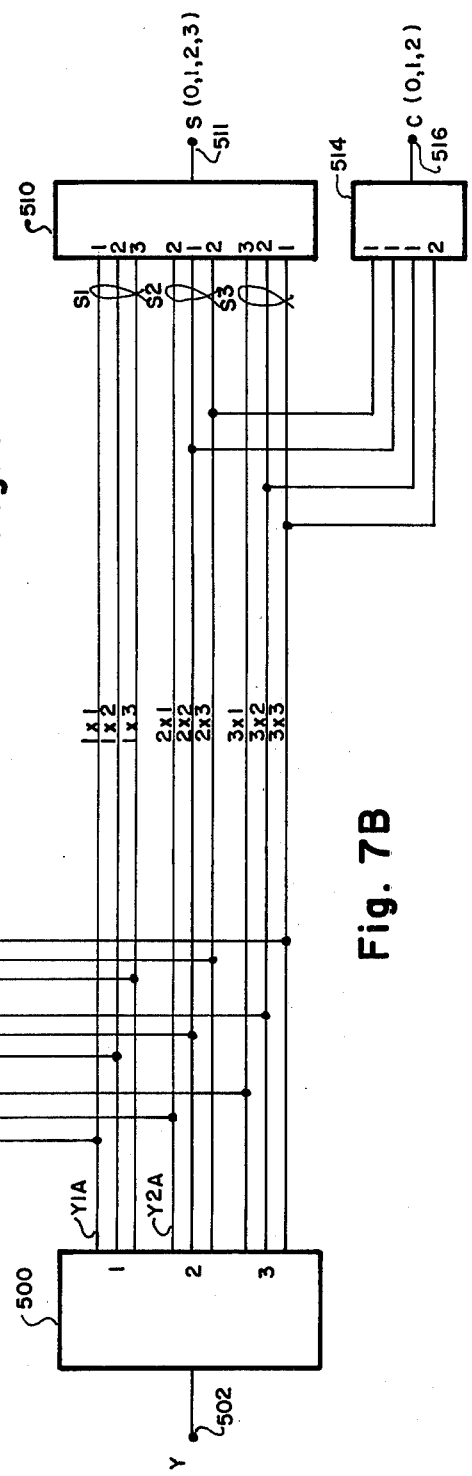
Fig. 7A
Fig. 7B

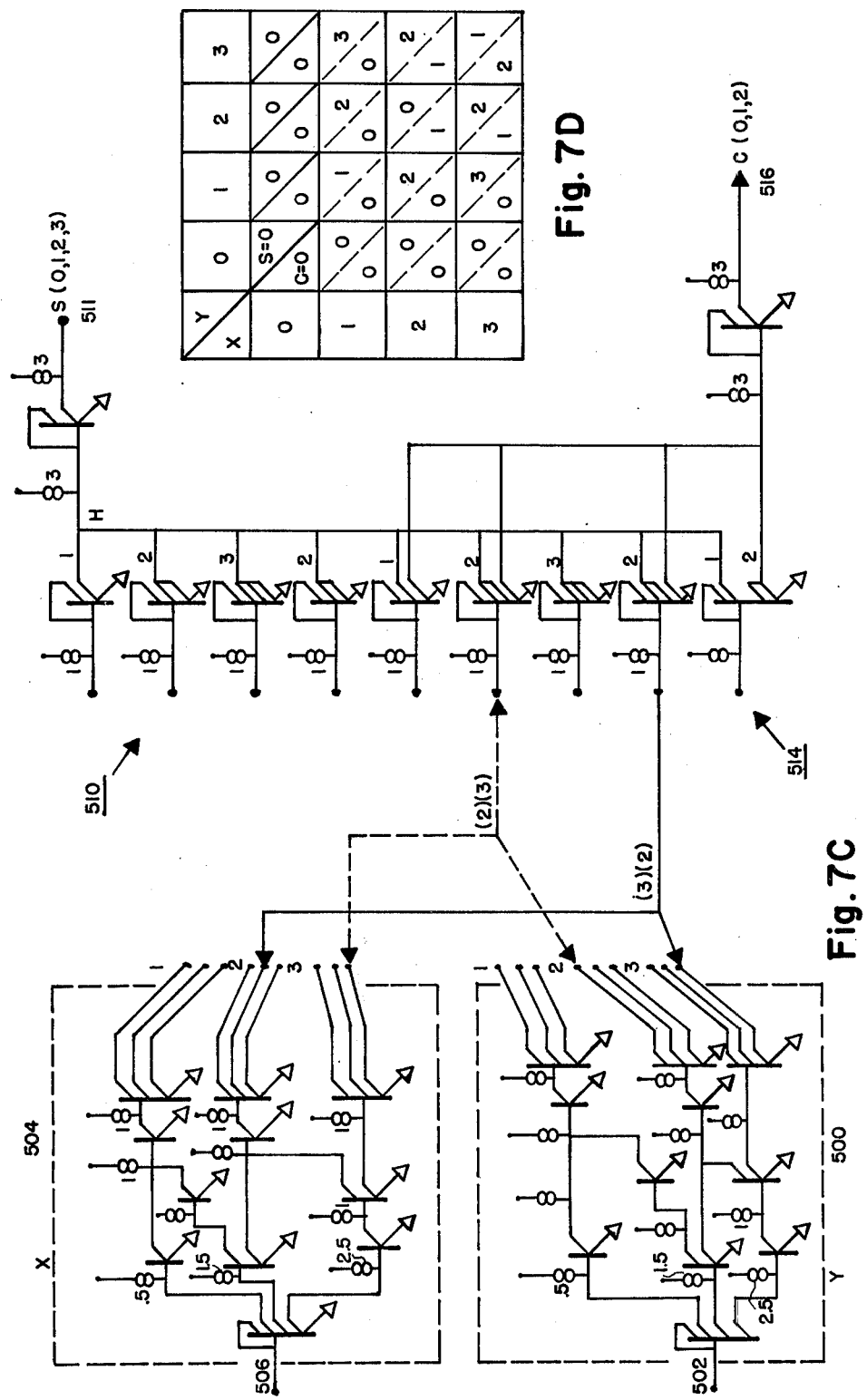

$x \cdot x^{-1} = 1 \text{ Mod } N$
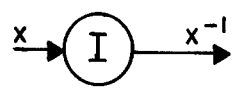
Fig. 8A
Fig. 8C
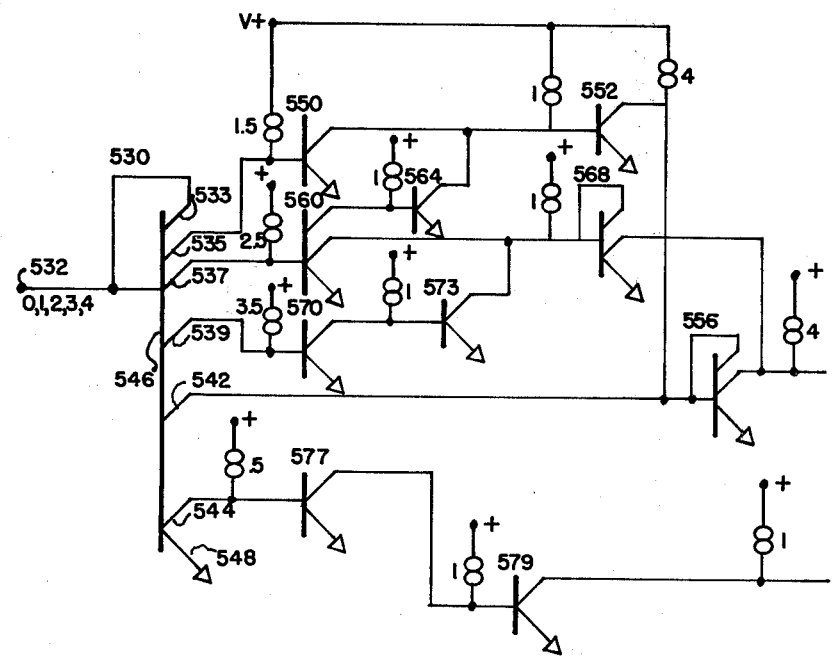
Fig. 8B

MULTIVALUED INTEGRATED INJECTION LOGIC CIRCUITRY AND METHOD

This is a continuation of application Ser. No. 718,328, filed Aug. 27, 1976 now abandoned.

CROSS REFERENCE TO RELATED APPLICATIONS

THRESHOLD INTEGRATED INJECTION LOGIC, Ser. No. 591,400, filed June 30, 1975, and now U.S. Pat. No. 4,081,822, invented by Tich T. Dao and Patrick A. Tucci and assigned to a common assignee.

BACKGROUND OF THE INVENTION

This invention relates generally to logic circuitry and a method for performing logic operations. More particularly, this invention relates to multilevel circuitry suitable for performing logic operations.

Although many types of logic circuits have heretofore been provided, such circuits have generally provided limited levels of operation, require excessive circuit elements and a correspondingly large semiconductor area to perform given logic functions. Thus there is a need for high performance logic circuitry having fewer circuit elements for performing given logic functions.

OBJECT AND SUMMARY OF THE INVENTION

Accordingly, it is a general object of the present invention to provide improved functional circuits which singly and as a group perform logic operations.

It is a particular object of the present invention to provide improved multilevel logic circuit elements which may be used singly or combined in circuit arrays having greatly reduced semiconductor area.

The foregoing and other objects of the invention are achieved in logic circuitry, and a method for operation providing predetermined logic outputs in response to logical combinations of inputs. The circuitry comprises a plurality of input devices for receiving logic inputs which are capable of assuming conduction states in response to the logic levels of the inputs. One or more output devices are connected to two or more input devices. Means having predetermined logic levels is provided and connected intermediate the input and the output devices. The means determines the conduction state of the output devices as a function of the input devices and the predetermined logic levels.

BRIEF DESCRIPTION OF THE DRAWINGS

FIGS. 1B–D are schematic diagrams of the logic gate in accord with the invention.

FIG. 2A is a symbolic logic block diagram of a minimum logic gate. FIGS. 2B–D are schematic diagrams of the logic gate in accord with the invention.

FIG. 7A is a symbolic logic block diagram of a product gate. FIGS. 7B and C are schematic diagrams of product gate circuits. FIG. 7D is a truth table for operation of the invention.

FIG. 8A is a symbolic logic block diagram of an inverse gate. FIG. 8B is a schematic diagram of an inverse circuit in accord with the invention. FIG. 8C is a table showing operation of the invention.

DESCRIPTION OF THE PREFERRED EMBODIMENTS

A group of logic circuits capable of performing multivalued integrated injection logic operations are shown in the accompanying Figures. Implementation of the circuit elements may be in an integral structure including a multiple collector switching transistor and a closely associated source transistor for providing injected carriers. The source transistor may be physically non-critically spaced from the switching transistor so long as the source transistor is in injection communication with the switching transistor. Physical implementation may be as disclosed in the above cross-referenced THRESHOLD INTEGRATED INJECTION LOGIC invented by Tich T. Dao and Patrick A. Tucci assigned to a common assignee.

As will be seen, the circuits may be generally characterized within known Post and modular logic systems. Circuits utilizing a four valued logic system are disclosed, but the circuits may readily be extended to any number of values N. Of course an N valued logic system is complete, if and only if, any multivariable function can be represented by constants, variables and well defined logic operations. More particularly, for N valued systems greater than two, Post algebra and modular algebra have developed in the art. Post algebra is defined as complete for any value of N, whereas modular algebra is defined as complete only for N as a prime number or a power of a prime number. The advantages of carrying out Post and modular system logic operations with multivalued injection logic will be more apparent as the circuits are now set forth.

Figure 1A:
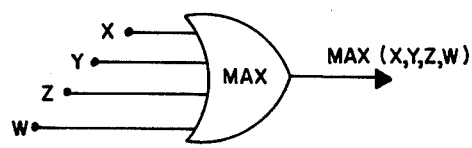
FIG. 1A is a symbolic logic block diagram of a maximum logic gate.
Figure 1B:
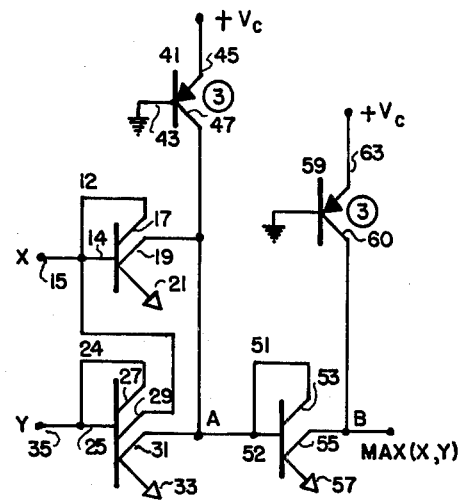

Referring to FIG. 1A, the first of the multivalued integrated injection logic circuits, a maximum (MAX) gate circuit is symbolically shown. A plurality of inputs X, Y, Z and W are connected to the input of the MAX logic gate. In operation, the gate provides an output which takes on the value of the maximum signal supplied to any of the input terminals. For purposes of the present application a four-valued logic set is described although the set may extend to any multivalued number N. Referring to FIG. 1B, a first embodiment of a MAX circuit is shown having first and second inputs X and Y. A first NPN transistor 12 has a base terminal 14 connected to the first input terminal 15. Input terminal 15 is capable of receiving a four-valued multilevel logic signal X. Transistor 12 further includes a first collector 17 and a second collector 19. Transistor 12 also includes an emitter 21 which may be a common emitter region in the corresponding integrated injection semiconductor structure or may be connected to a common or ground terminal. First collector 17 is connected to base terminal 14 to provide a normalized feedback connection in accord with the practice previously described in the above reference patent application, THRESHOLD INTEGRATED INJECTION LOGIC, invented by Tich T. Dao and Patrick A. Tucci and assigned to a common assignee.

The two input MAX circuit further includes a transistor 24 having a base terminal 25, a first collector 27, a second collector 29 and a third collector 31. Transistor 24 also includes an emitter 33 similarly formed as a part of a common region in the semiconductor structure or connected to a common or grounded terminal. Base 25 is connected to an input terminal 35 which is capable of receiving a four-valued input logic signal Y. Collector 27 is connected to base 25 is provide a normalized feedback connection for transistor 24. Collector 29 is connected to base 14 of transistor 12 and collector 31 is connected to collector 19 of transistor 12. The MAX logic circuit further includes a PNP current source transistor 41 having a base 43, an emitter 45, and a collector 47. Transistor 41 is structurally configured so that in operation a current flow out of 47 is provided having a weighted level of 3 units. As will be seen, the relationship of this weighted current source at collectors 19 and 31, in relationship to the four-valued input signal levels of 0, 1, 2 and 3 incremental current units at X and Y signal inputs determines the multivalue circuit operation. Collector 47 is connected to the base terminal 52 of an additional transistor 51. Transistor 51 includes a first collector 53 and a second collector 55. An emitter element 57 is further included as a part of a common region in injection logic or connected to a common or ground terminal. First collector 53 is connected in a normalized feedback connection to base 52. The second collector 55 is connected to a collector 60 of PNP current source transistor 59. Transistor 59 has a base 61 connected in a common region or to a common or ground terminal and an emitter 63 connected with emitter 45 of transistor 41 to voltage supply means. Transistor 59 has a geometric structural relationship to provide a weighted current of 3 units flowing out of collector 60 in normal operation. Second collector 55 of transistor 51 is connected to an output terminal to provide a maximum (MAX) function of the input logical signals X and Y.

Figure 1C:
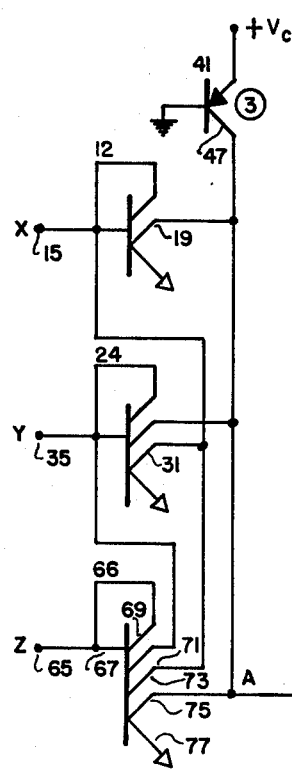

The MAX multivalued logic circuit of FIG. 1B may be further expanded to a three input MAX gate circuit as is shown in FIG. 1C. An additional input terminal 65 is provided which is capable of receiving an additional four-valued logic signal Z. Terminal 65 is connected to a base 67 of an additional NPN transistor 66 having a first collector 69, a second collector 71, a third collector 73 and a fourth collector 75. Transistor 66 further includes an emitter 77 also realized as a portion of a common region or connected to a common or ground terminal. First collector 69 is connected in a normalized feedback connection to base 67, second collector 71 is connected to input terminal 35, the third collector 73 is connected to third collector 31 of transistor 24 and fourth collector 75 is connected to collector 47 of transistor 41. It can thus be seen that the two input circuit of FIG. 1B may be readily extended to the three input circuit of FIG. 1C. Further extensions to any Number inputs can be carried out.

Turning now to the operation of FIG. 1B and FIG. 1C circuits, the input and output logic currents must first be assigned values of 0, 1, 2 and 3 increment current units. For purposes of illustration, the respective current values may be viewed as idealized current sources connected between terminal 15 and common for the X input signal capable of assuming current magnitudes of 0, 1, 2 and 3 units of current. A similar additional idealized current source may be viewed as connected between terminal 35 and common for the Y signal which may also assume current values of 0, 1, 2 and 3 units. Further, the semiconductor structural characteristics of the collectors of the respective devices are substantially similar and the current in the normalized current connection via the respective feedback collector to base connections is mirrored in each of the collectors within each of the respective devices, such as devices 12 and 24. To further examine operation, a current node A may be defined at the junction of collectors 19, 31 and 47 and a further current node B at the junction of collectors 55 and 60.

To consider all possible input signal magnitudes a first signal magnitude wherein X is greater than Y will first be considered, followed then by the reverse condition. Moreover, the inherent design of the semiconductor structure is such that exactly Y amount of current from the X signal input can be absorbed by each collector of transistor 24. For a first magnitude of X greater than the magnitude of Y any collector of transistor 12 will absorb exactly $(X - Y)$. Specifically, a Y signal input at base 25 provides a feedback of Y at collector 27 and likewise a mirrored value of Y at collectors 29 and 31. The net current at 29 which is connected to input X and base 14 is, of course, Y. This input at device 12 provides an $(X - Y)$ feedback current level at collector 17 and a mirrored $(X - Y)$ level at collector 19. Summing currents at node A provides three units into node A from collector 47, minus $(X - Y)$ from collector 19, minus Y from collector 31. The current input to transistor 51 is equal to: $3 - (X - Y) - Y = (3 - X)$. Continuing then, any collector of transistor 51 will absorb $(3 - X)$. Thus, the current at the output node B is: $3 - (3 - X) = X$. For this assumption X was greater than Y, therefore the output X has been determined to be the maximum of (X, Y).

For the magnitude of $X \leq Y$, it is seen that all the input current is absorbed by a collector of transistor 24, transistor 12 is cut off and the input current to transistor 51 is equal to $3 - Y$. The available output current is: $3 - (3 - Y) = Y$ which is the maximum function of X, Y or MAX (X, Y). For FIG. 1C with similar assumptions:

into collector 19:
    = $X - Y$, if $X > Y$ and $Y > Z$
    = $X - Y$, if X is $>$ z and Z is $\geq$ Y
    = 0 if $Y > Z$ and $Y > X$
    = 0 if $Y \leq Z$ and $Z > X$
from X toward collector 31:
    = Y, if $Y > Z$
    = Z, if $Y \leq Z$
into collector 31:
    = $Y - Z$ if $Y > Z$
    = 0, if $Y \leq Z$
at node A:
    = 3 − MAX (X, Y, Z)
at node B:
    = MAX (X, Y, Z)

An alternative embodiment of the MAX circuit is shown in FIG. 1D, utilizing parallel operated input circuitry in contrast to the serial input circuitry of FIGS. 1B and 1C. In FIG. 1D, an input device such as previously described transistor 66 is utilized having output collector nodes D, E and F at each of the collectors 71, 73 and 75 respectively. A current source transistor 41 has plural collectors connected to each of the respective nodes wherein the geometry and structure of the respective collectors provides one unit of current to node D, two units of current to node E, and three units of current to node F. First and second inverter transistors 51 are serially connected between node E and node A2 which is connected via further transistor 51 to output node B. A second, serially connected pair of transistors 51 is connected between node F and node A1 and then via an additional transistor 51 to node B. A further transistor 51 is connected between node D and output node B. A single unit current source transistor 41 has first and second collectors 47, the first connected to the first serial path at the junction of transistors 51 and the second to the junction of the second serial path connected transistors 51. An additional source transistor 41 provides single unit current sources via respective unit collectors to nodes A1 and A2 respectively. A current source transistor 59 provides three units of current to node B. Although only one stage capable of receiving a single logic signal X is provided, it is apparent that for additional input lines the structure shown in fanned out with the exception of the current source 41 connected to nodes A1 and A2 for additional inputs. Each of the additional stages have the respective transistor 66 node D collector connected to node A3, with similar bus bar connections for each of the remaining stages to the A1 and A2 nodes. In operation, depending on whether magnitudes of 0, 1, 2 or 3 are provided, the maximum of these levels causes 3, 2, 1 or none of the output devices connected to nodes A1, A2 and A3 to be activated. If, for example, the input represents two units of current which is greater than any input of the remaining inputs, then node D is equal to node E which assumes a low condition. However, node F assumes a high or one condition. With this input, node A1 will draw one unit of current from source 59 and the output at node B will thus be two units. Further, it will be seen that if any of the inputs are one or higher, then the transistor 51 connected to A3 will be turned off, if any are two or higher, the transistor 51 connected to A2 will be turned off and so on to provide a maximum function at node B.

Referring to FIG. 2A, the logic functional block for performing a minimum (MIN) function is shown. A plurality of inputs X, Y, Z ... W are received by the MIN gate and an output MIN (X, Y, Z, W) is provided. One alternative for providing a MIN gate is to utilize the MAX gate previously described in combination with the gate of FIG. 2B and utilizing the following identity:

$$\text{Min}(X_1, Y_2 \ldots, X_j) = \text{to}(N-1) - \text{Max}[(N-1, -X_1), (N-1-X_2) \ldots, (N-1-X_j)]$$

where (N − 1) is defined to be the maximum value attainable by any variable $X_j$. for four-valued logic, (N − 1) is equal to 3. Referring to FIG. 2B, a gate is shown comprising a first transistor 51 and a second transistor 59 as previously described. In operation, $$Y = (N - 1) - X$$

where it may be seen that a plurality of gates may be substituted for each of the right-hand expressions (N − 1) − X to thereby provide a Min logical function.

Figure 2C:
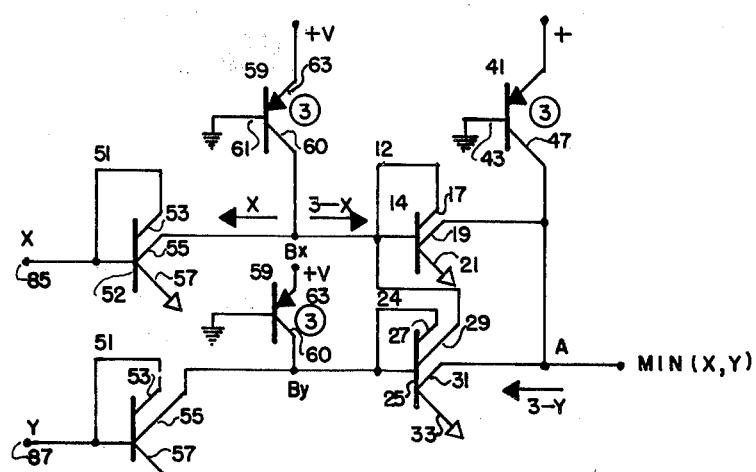

An alternative MIN gate is shown in FIG. 2C. The MIN may be seen to comprise first and second circuits as previously shown in FIG. 2B which are interconnected to precede the transistors 12 and 24 of the MAX circuit of FIG. 1B. Further, the output inverter transistor 51 previously shown and associated current source transistor 59 may now be deleted. More specifically, a first X logic signal input at terminal 85 is connected to base 52 of transistor 51 which has a first normalized feedback collector 53 and a second collector 55. Emitter 57 is connected as a part of a common region or connected alternatively to a common ground. Collector 55 is connected to collector 60 of transistor 59 and further connected to base 14 of transistor 12. Transistor 59 has a base 61 connected to a common region or common connection and an emitter 63 connected to a voltage supply means V. Transistor 12 has a first collector 17 connected in a normalized feedback connection to base 14 and a second collector 19 connected to current node A. Emitter 21 is connected to a common region.

The second input logic Y is connected to an input terminal 87 which is connected to a base 52 of an additional transistor 51 and connected to an additional transistor 59 having identical connections and nomenclature to that previously described in conjunction with the X logic signal path. The additional transistor 51 output collector 53 is connected to the base 25 of transistor 24 which has a first collector 27 connected in a normalized feedback connection to base 25, a second collector 29 connected to base 14 of transistor 12, and a third collector 31 connected to node A. Emitter 33 is connected as a part of a common region or connected to a common connection. An additional current source transistor 41 has an emitter 45 connected to the voltage means V, a base 43 connected to the common region or ground and a collector 47 connected to node A.

Turning now to the operation of the FIG. 2C circuit, the current flow at nodes Bx, By and A must be noted. The current flow from node Bx toward collector 55 by virtue of the feedback connection will always be identical or a mirror of that provided in input terminal 85. Thus transistor 59 provides three units of current flow into node Bx, the resultant flow toward base 14 of transistor 12 must be accordingly equal to 3 − X. A similar relationship exists for current flows to and from node By, that is, a mirrored current flow Y flows into collector 55, three units of current flows into the node from collector 60 and 3 − Y units flow out of the node into base 25. Further, it is noted that the current flow into collector 17 of transistor 12 is equal to that at the input base 14 and is equal to 3 − X units. In transistor 24, for a current flow of 3 − Y into base 25 a current of 3 − Y must be mirrored into collector 31. Thus, the following relationships hold:

$$= (3 - X) - (3 - Y) = Y - X, \text{ if } (Y > X)$$

$$= 0 \text{ (if } Y < X)$$

expressing the current flows into collector 17 and 19 respectively.

Thus at node A:

$$3 - (3 - Y) - (Y - X) = X, \text{ if } (Y > X) \text{ or } 3 - (3 - Y) = Y, \text{ if } Y < X$$

Thus for either input condition, circuit operation provides a MIN output function for the input logic signals X and Y.

Figure 2D:
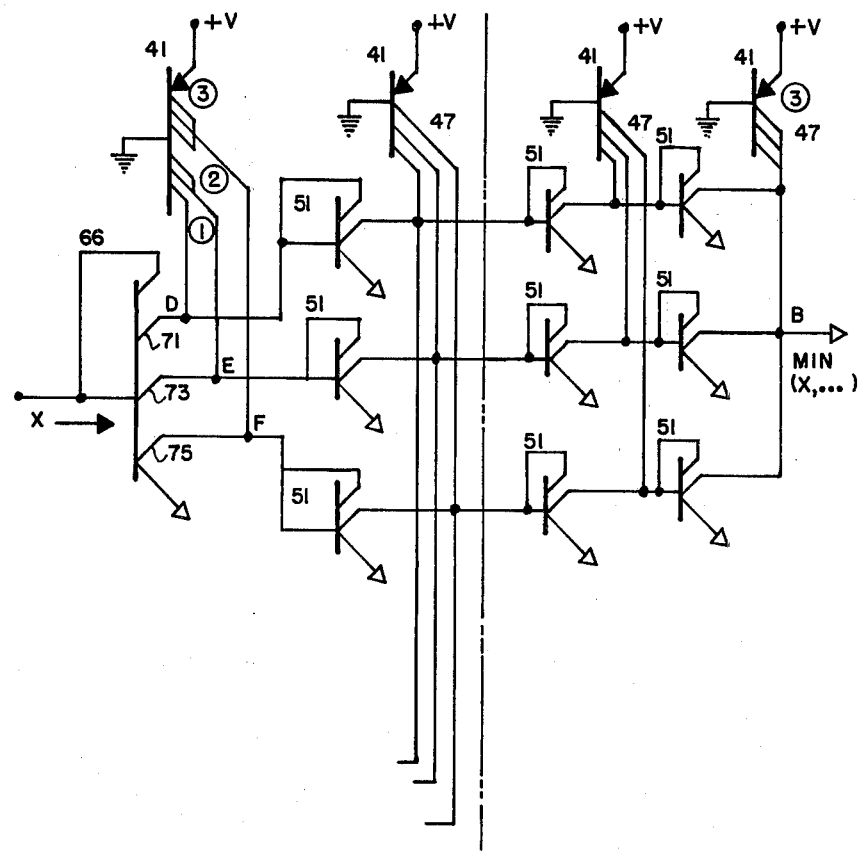

Turning to FIG. 2D, a MIN gate utilizing parallel operation as contrasted to the previously described serial operation is shown. A single input terminal is connected to receive the logic signal level X and connected to a base of a transistor 66 as previously discussed. A first current source transistor 41 has multiple collectors providing current levels of one connected to collector 71 of transistor 66 and defining node D. Transistor 41 has a second collector providing a current level of two units connected to collector 73 of transistor 66 and defining node E. Transistor 41 has a further current output of three units connected to collector 75 of transistor 66 and defining node F. Three serial connected transistors 51 are connected between node D and node B. Current source transistors provide one unit of current at each of the two nodes intermediate the serial connection. A similar serial connection is provided between node E and node B and yet a further serial connection between node F and node B. An additional current source transistor 41 provides three units of current to node B. Although only a single input line is shown, additional input lines require only additional input transistors 41, 51 and 66. The operation of the FIG. 2D circuit is similar to that of the previously described MAX circuit (parallel wired) in that the plural bus lines in FIG. 2D extend from a different level of inversion when comparing the two circuits. In the FIG. 2D structure the bussing occurs at the second level of inversion for the MIN circuits. In contrast the bussing occurs at the third level of inversion for the previously discussed MAX circuit. It is seen that for the MIN circuit four additional NPN devices are necessary for each input logic line. In the previously described MAX circuit, five additional NPN devices are necessary.

Figure 3A:
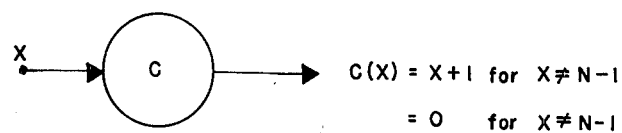
FIG. 3A is a symbolic logic block diagram of a cycle gate in accord with the invention.
Figure 3B:
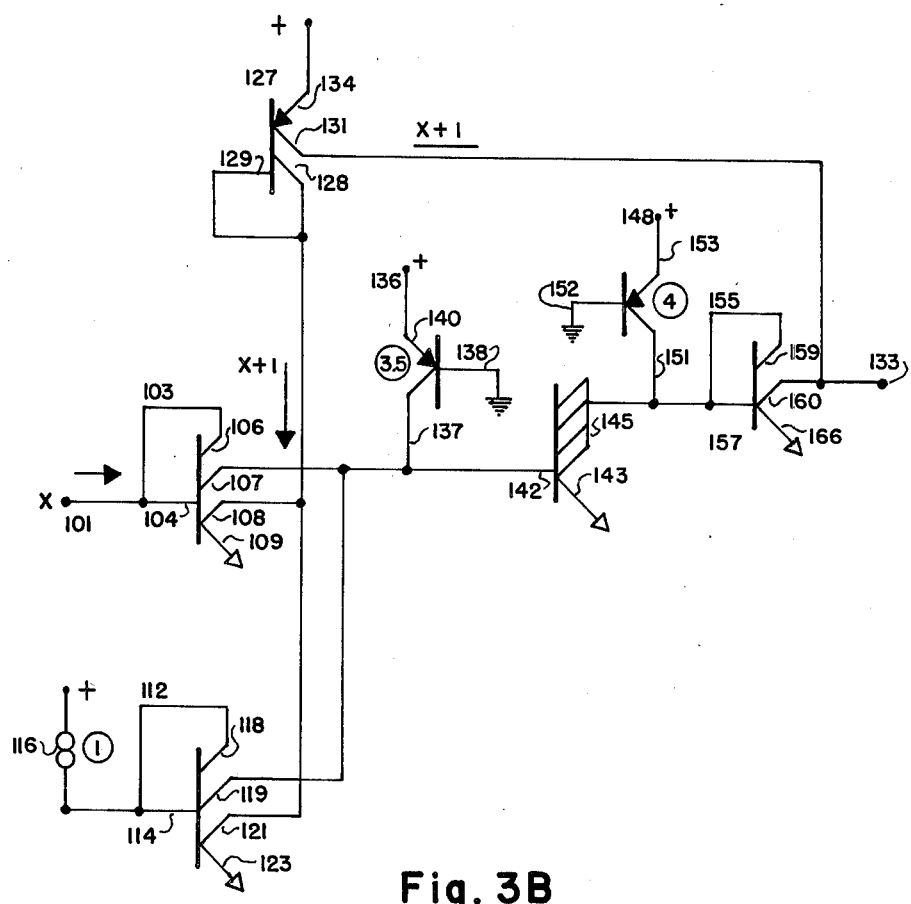
FIG. 3B is a schematic diagram of the cycle gate.

Referring to FIG. 3A, a cycle gate functional block is shown. The cycle gate functional block sequentially increments the logic level signal input in predetermined unit steps in response to the input signal. If, however, the input logic value is a maximum (N − 1) then the output takes on the minimum value (0). In FIG. 3B, the cycle gate logic circuitry is shown. An input terminal 101 is provided which is capable of receiving a logic signal X. Terminal 101 is connected to transistor 103, specifically the base electrode 104. Transistor 103 includes a first collector 106, a second collector 107 and a third collector 108. First collector 106 is connected in a normalized feedback connection to base 104. Transistor 103 further includes an emitter 109 which may be a portion of a common region or connected to a common terminal. The cycle gate further includes a transistor 112 having a base 114 which is connected to a unit current source 116. Transistor 112 further includes a first collector 118 which is connected in a normalized feedback connection to base 114, a second collector 119 and a third collector 121. Transistor 112 includes an emitter element 123 which is formed as a portion of a common region or connected to a common terminal. Collector 119 is connected to collector 107 of transistor 103 and collector 121 to collector 108 of the same transistor. Collector 108 of transistor 103 is further connected to an additional transistor 127, specifically a first collector 128. Collector 128 is also connected in a normalized feedback connection to base 129 of transistor 127. Transistor 127 further includes a second collector 131 connected to an output terminal 133. Transistor 127 has an emitter 134 connected to external voltage supply means.

The cycle gate further includes a current source transistor 136 having a collector 137 connected to collector 107 of transistor 103, a base 138 connected to a common region or terminal and an emitter 140 connected to voltage supply means. Collector 137 is further connected to a base 142 of an additional transistor 141. Transistor 141 includes an emitter or a common region 143 and three unit current collectors interconnected as a common 3 unit collector 145. Collector 145 is connected to an additional current source transistor 148. Transistor 148 has a collector 151, a base or common region 152 and an emitter 153 connected to the voltage supply means. Transistor 148 is structurally configured to provide four units of current. Collector 151 or transistor 148 is further connected to an additional output transistor 155 comprising a base 157, a first collector 159, a second collector 160 and a common or interconnected emitter element 166. Collector 159 is provided with a feedback normalization connection to base 157. Collector 160 is connected to output terminal 133.

Turning now to operation of the cycle gate, the logic level input signal X appears at input terminal 101 is mirrored at collector 108. Similarly collector 119 provides a mirror of the single unit generator 116 to provide a total of X + 1 units of current flowing out of collector 128 of transistor 127. Accordingly, the mirrored output from collector 131 is identically X + 1 delivered to the output terminal 133 so long as transistor 155 is in an OFF condition. As input signal X continues to increment, transistor 141 is held in an ON condition by transistor 136 until the combination of collectors 107 and 119 draw off or sink a total of three units at collector 107 and one unit at collector 119, for a total of four units of current. At this point the current source 136, providing 3.5 units of current, can no longer sustain transistor 141 in an ON condition, the transistor assumes an OFF condition and transistor 155 assumes an ON condition providing a mirrored four units of current sink by virtue of transistor 148. At output terminal 133 the net result is of four units inflow from collector 131 and four units being sinked by transistor 155 for a total of zero net current at terminal 133. As will later be seen, this circuit is merely a special case of a full adder ciricuit useful for modular logic operations.

Figure 4A:
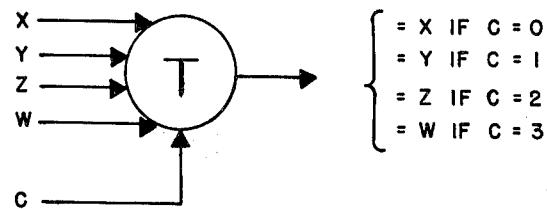
FIG. 4A is a symbolic logic block diagram of a multiplexer gate in accord with the invention.
Figure 4B:
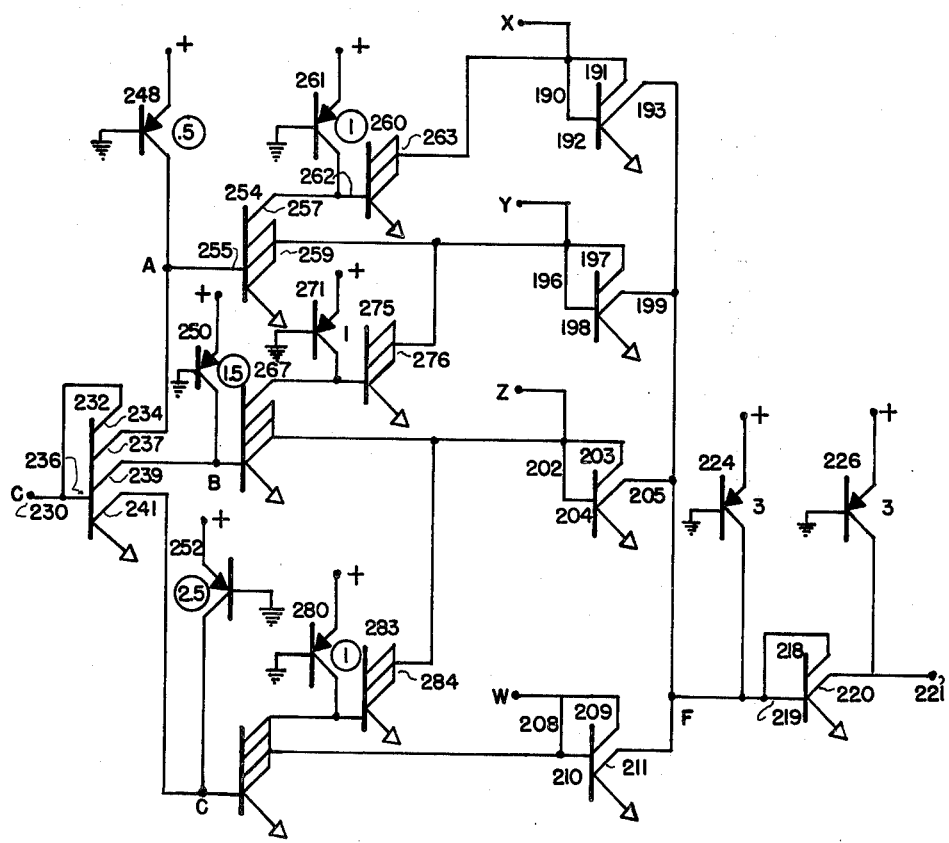
FIG. 4B is a schematic diagram of the multiplexer gate.

Referring to FIG. 4A, a multiplexer symbolic logic block is shown. The multiplexer circuit selects one out of the N input variables (X, Y, Z, W) depending on the value of the controlled variable C applied. More specifically, a multivalued circuit embodiment of the multiplexer is shown in FIG. 4B. Each of the logic input signals X, Y, Z and W are applied to the respective bases of transistors 190, 196, 202 and 208. The first collector 191 of transistor 190 is connected in a normalized feedback connection to base 192. The second collector 193 is connected to a current node F. A first collector 197 of transistor 196 is connected to base 198 and a second collector 199 is connected to node F. The transistor 202 includes a first collector 203 connected to base 204 in a normalized feedback connection and a second collector 205 which is connected to node F.

Transistor 208 includes a first collector 209 which is connected to base 210 and a second collector 211 which is connected to node F. Each of the respective transistor devices 190, 196, 202, and 208 have emitter elements which may be a common emitter region or may be separate regions which are connected in common. A transistor 218 has a base 219 connected to node F and further connected in a normalized feedback connection to a collector 220. Again, an emitter region may be used in common with the other injection logic circuitry emitters or separate regions may be connected in common. Collector 220 is connected to an output terminal 221. A first current generator transistor 224 is provided and has a collector connected to node F to provide three units of current as well as a second current generator 226 also providing three units of current to the output terminal 221.

Turning now to the control variable circuitry, the input control variables which may assume levels of 0, 1, 2 and 3 are connected to a control terminal 230 which is connected to a base of a multicollector transistor 232. A first collector 234 is connected to the base 236, a second collector 237 is connected to a node A, a third collector 239 connected to a node B and fourth collector 241 connected to node C. Respective current generator transistors 248, 250 and 252 provide respectively 0.5 units of current to node A, 1.5 units of current to node B and 2.5 units of current to node C. The control variable circuitry further includes an additional collector transistor 254 having a base 255 connected to node A, a first collector 257 capable of carrying one unit of current connected to a base of transistor 260 and three additional collectors connected in common as a single three unit collector 259 which is connected to the base 198 of transistor 196. A single unit current source of transistor 261 is connected to the base 262 of transistor 260. Transistor 260 has three unit current collectors connected in common as a single collector 263 which is connected to base 192 of transistor 190. Transistors 254 and 260 both have emitter elements which may be portions of a common emitter region or may be separate regions connected in common. Further, identical circuitry is provided by transistor 267 having a base connected to node B, a single unit current generator transistor 271 and transistor 275 which has three single unit collectors connected in common as collector 276 which is connected to base 198 of transistor 196. Identical circuitry is provided in the interconnection of transistor 277 having a base connected to node C, single unit current source transistor 280 and transistor 283 having three single unit collectors connected in common as collector 284 which is connected to base 204. The three unit collector combination of transistor 267 is connected to base 204 of transistor 202 and the three unit collector combination of transistor 277 connected to base 210 of transistor 208.

Turning now to operation of the multiplexer circuitry, for four control condition levels of C = to 0, 1, 2 and 3 will be shown. For C having a level of zero, transistor 232 is in an OFF state. Thus, transistors 254, 267 and 277 are turned on by the respective current source transistors 248, 250 and 252. At the same time transistors 260, 275 and 283 are in an OFF state. For these conditions, the input logic signal at X is reproduced by the mirror connection of transistor 190 and transistor 218 at the output terminal 221. Transistors 254, 267 and 277 at the same time shorted to the common or ground the input levels provided at Y, Z and W.

For the condition when the control variable C is equal to one, transistor 248 can only source 0.5 units of current, thus transistor 254 is turned OFF while transistors 267 and 277 remain in the ON state. Accordingly, transistor 260 is turned ON and shorts input level X to ground or common. At the same input level Y is permitted to pass through transistor 196 since transistor 254 and 275 have now assumed an OFF condition. Input logic signals at Z and W remain shorted or grounded to common through transistors 267 and 277. Thus, for C = 1 the output at terminal 221 is equal to Y.

Continuing for C at a condition of two, transistor 250, which is set at 1.5 units of current, as well as transistor 248 are unable to sustain the input current levels, and transistors 254 and 267 turn OFF while transistor 277 remains in the On state. Therefore, levels X and Y are now shorted to ground as well as the W levels through the respective transistors 260, 275 and 277. Logic signal Z thus passes through transistor 202 to the output terminal 221. Similarly, for the condition where the control variable C is equal to 3, all three transistors 254, 267 and 277 assume an OFF state and transistors 260, 275 and 283 assume an ON state. Therefore, only signal W appears at the output terminal 221.

Figure 5A:
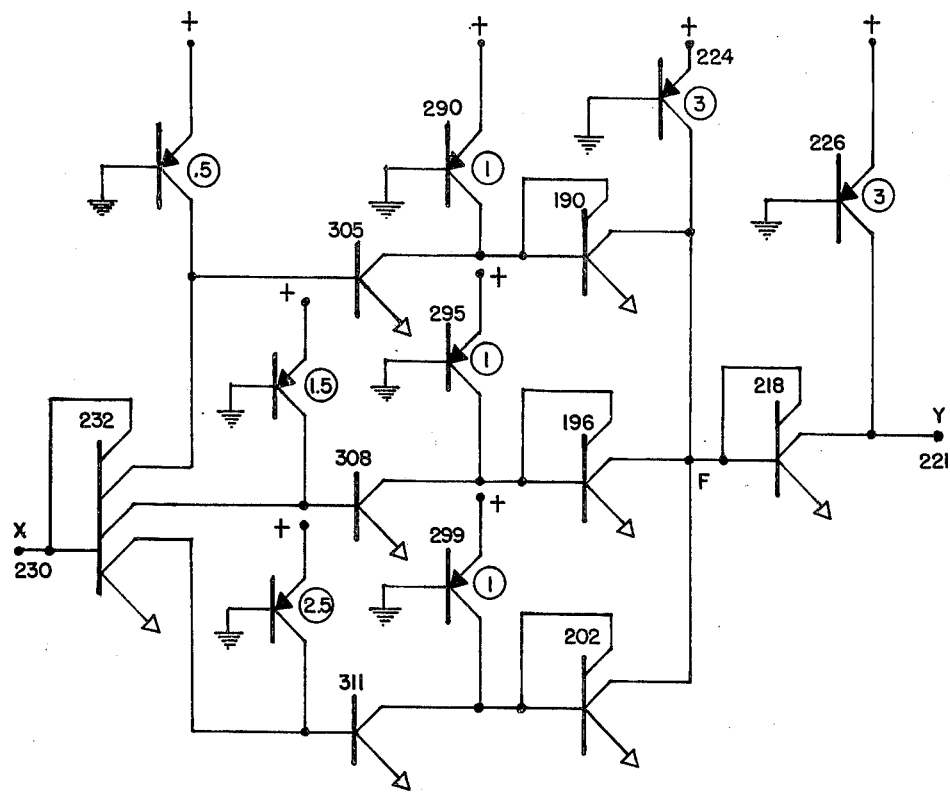
FIG. 5A is a schematic diagram of a quantizer logic circuit in accord with the invention.

Referring to FIG. 5A, the multiplexer circuit of 4B is simplified and used as a quantizer circuit. In both the Post logic system previously described and the modular logic to be subsequently described, signal levels deteriorate as signal flow continues. It is thus necessary to restore these levels to their normalized values to insure satisfactory logic manipulations. The quantizer circuit of FIG. 5A may be utilized to perform this operation. Briefly in overview, it should be noted that the circuit differs from the FIG. 4B circuit only in that three input logic levels need be provided with reference to a four common level. Since signal levels are quantized at incremental unit current levels, it is only necessary to provide a circuit such as the FIG. 4B. In FIG. 4B the multiplexer in response to the input signal levels can selectively switch between incremental unit input current source generator transistors such as transistors 290, 295 and 299. The output collectors of these respective devices may be viewed as connected to provide logic signals X, Y and Z respectively, in the preceding multiplexer circuit.

More specifically, however, the input signal is reproduced in triplicate at the collectors of transistor 232. Simultaneous threshold detections are then accomplished at the respective bases of transistors 304, 308 and 311. Unit current generators 290, 295 and 299 are next switched in accord with transistors 190, 196 and 202, and depending on the respective OFF states of transistors 305, 308 and 311. The signal at node F is inverted and the output provided at terminal 221 as the combination of output transistors 218, 224 and 226.

In operation, for an input signal $X < 0.5$, output Y assumes a level of zero. For an input value of $X \geq 0.5$, but $< 1.5$, the output Y assumes a level of one. For the value of $X \geq$ to 1.5, but $< 2.5$, the output Y assumes a level of two. Finally, for a value of $X \geq$ to 2.5 the output Y assumes a value of three. In terms of circuit operation, for the first case described transistors 305, 308 and 311 are ON, and all three transistors 190, 196 and 202 are starved and the output assumes a value of zero. For the second case, transistor 305 is turned OFF, and transistor 308 and 311 are turned ON. Thus, only transistor 190 provides one unit of current at node F and the resulting output is one unit at terminal 221.

Figure 5B:
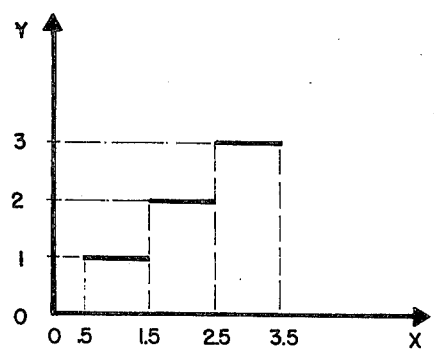
FIG. 5B is a graphical representation of the operation of the FIG. 5A circuit.

For the third case, that is, the value of $X \geq 1.5$ and $<$ 2.5, transistors 305 and 308 assume an OFF condition and transistor 311 an ON condition. Further, transistors 190 and 196 now absorb one unit of current from transistor 224 resulting in two units of current appearing at terminal 221. For the case where $X \geq 2.5$ units, transistors 305, 308 and 311 are turned OFF and transistors 190, 196 and 202 assume ON conditions, sinking the three units of current provided by transistor 224. As a result three units are provided at output terminal 221. The quantizer operation is further evident in the relationship of the input signal X and the output signal Y shown in FIG. 5B.

Figure 6A:
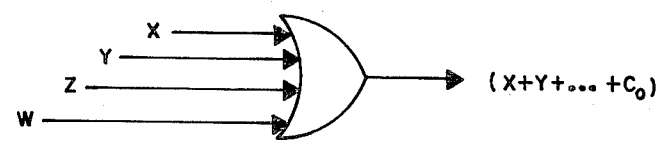
FIG. 6A is a symbolic logic block diagram of a sum gate in accord with the invention.
Figure 6B:
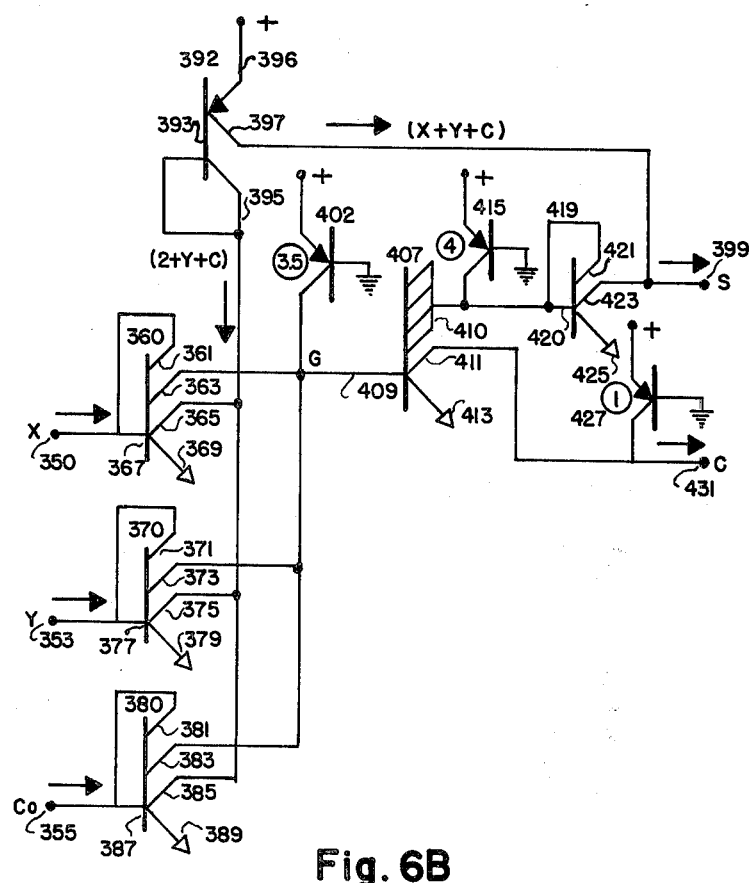
FIG. 6B and D are schematic diagrams of the sum gate.

Turning now to the modular logic system, the SUM logic gate is symbolically shown in FIG. 6A. In operation, inputs X, Y, Z and W, provide an output of (X + Y + Z + W) modulo N. More specifically, a multi-value circuit capable of performing a SUM operation is shown in FIG. 6B. The SUM gate includes an input terminal 350 capable of receiving a multivalued logic X, input terminal 353 capable of receiving a four-valued input logic signal Y and a terminal 355 capable of receiving a two-valued carry ($C_0$) input signal. A first input transistor 360 has a first collector 361, a second collector 363, and a third collector 365. A base element 367 is provided and an emitter element 369 is further included and may be a part of a common region or may be connected to a common terminal. First collector 361 is connected to base 367 to provide a normalized feedback connection. The SUM gate further includes a transistor 370 having a first collector 371, a second collector 373, and a third collector 375. Transistor 370 has a base element 377 and an emitter element 379 connected to a common region or terminal. The gate further includes transistor 380 having a first collector 381, a second collector 383, and a third collector 385. Transistor 380 includes a base region 387 and an emitter region 389. First collector 381 is connected in a normalized feedback connection to base 387. Collectors 365, 375 and 385 are connected to transistor 392, specifically collector element 395. Base region 393 is connected to collector 395. Transistor 392 further includes an emitter region 396 and a second collector region 397. Emitter 396 is connected to voltage means and collector 397 is connected to an output terminal 399. Collectors 363, 373 and 383 of transistors 360, 370 and 380 are connected to node G. A current source transistor 402 having an output of 3.5 current units is also connected between voltage means and node G. A transistor 407 is further included having a base 409 connected to node G, a first collector element 410 capable of carrying 4 units of current, a second collector 411 and an emitter element 413. Emitter 413 may be a common region in the injection logic structure or may be connected to a common terminal. Transistor 407 has an additional current source transistor 415 providing four units of current connected between collector 410 and voltage means. An output transistor 419 has a base 420 connected to collector 410, a first collector 421 connected in a normalized feedback connection to base 420, a second collector 423 connected to output terminal 399 and a third emitter region 425 connected as a common region or common terminal. An additional source transistor 427 provides one unit of current to output terminal 431.

Turning to operation, logic level inputs X, Y and Z provide a SUM output at terminal 399 and a possible carry output C at terminal 431. More specifically, the input currents from the respective signals X, Y and Z are replicated at each of the collectors for the respective transistors. For example, for a logic X level of one unit flowing into terminal 350 a one unit current sink flow is provided by collector 363. The respective collectors 363, 373 and 383 are responsive to the input unit current levels to sink the current provided by transistor 402 at node G. In like manner, the current sinks provided by collectors 365, 375 and 385 sink the summed current at collector 395 of transistor 392. Transistor 392 mirrors this sum (x, y, z) at collector 397 and at output terminal 399. So long as transistor 419 is in an off state the output at terminal 399 continues to be the sum provided by collector 397. However, when the current sinked from node G exceeds that provided by the current source 402, that is 3.5 units, then transistor 407 will be turned off. When on transistor 407 was absorbing four units of current provided by current source 415. Now that 407 is off transistor 415 provides four units of current to transistor 419 which replicates this current at collector 423 for summing at terminal 399. It is further apparent that when transistor 407 is turned off collector 411 no longer sinks current source 427 to ground and thus the output at terminal 431 assumes a one unit current level. Further combinations of input signal levels and the outputs they determine are apparent from the table shown in FIG. 6C.

Figures 6C, 6D:
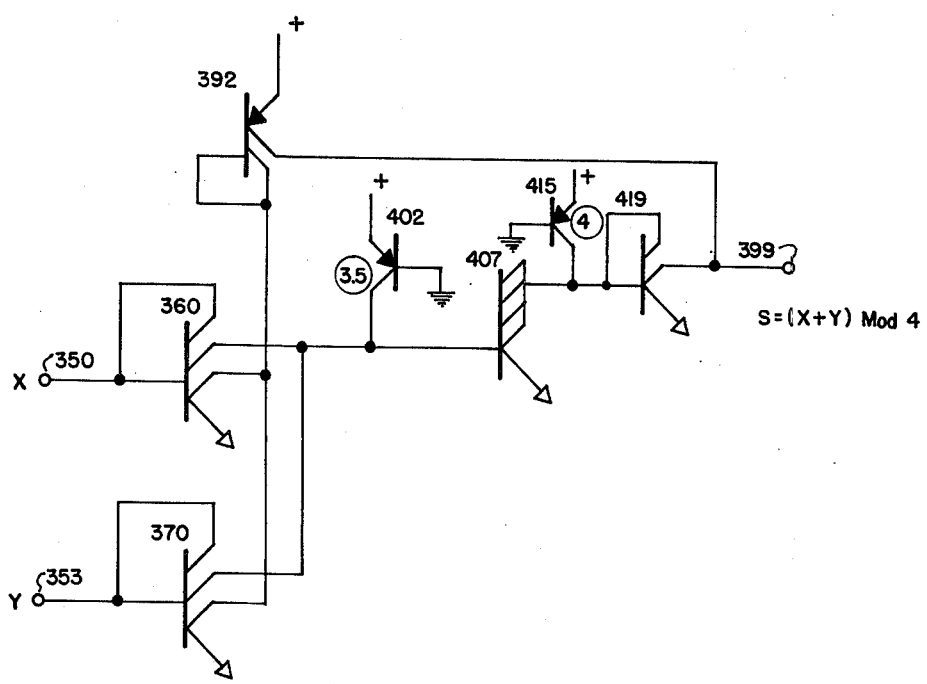
FIG. 6C is a truth table for operation.

Referring to FIG. 6D, a special case of the FIG. 6B circuit is shown wherein the input $C_0$ and the output C have been deleted to provide an output corresponding to the SUM Modulo 4 of signals X and Y. Operation is identical to that above described with the deletion of the C carry conditions.

Referring to FIG. 7A, the PRODUCT gate is shown for providing an output arithmetic product modulo N for plural inputs X, Y, Z and W. In operation, the presence of multivalued logic signals at the input provides an arithmetic product of those signals at the output modulo N. Referring to FIG. 7B, an initial overview of the PRODUCT gate is shown. The gate, shown for two inputs X and Y, includes a first Y subcircuit 500 having an input terminal 502 capable of receiving a multivalued Y input logic signal. Subcircuit 500 provides outputs for each of the multivalued logic levels 1, 2 and 3. The zero level may be utilized as a reference level. Each of the outputs includes a three terminal bus denoted by the subcircuit, the output and the bus line, such as Y 1A to denote the Y subcircuit, the number 1 bus, and the A lead of such bus. Similar nomenclature may be applied to denote the Y2 and Y3 bus outputs. Further included in the PRODUCT gate is X subcircuit 504 having an input connected to a terminal 506 and capable of receiving a multivalued input signal level X. In like manner, subcircuit 504 has numbered output busses 1–3, each having individual lines A–C. The output busses from subcircuit 504 have individual leads fan out to connect to individual leads of the Y subcircuit 500. Specifically, X 1A connects to Y 1A, X 1B connects to Y 2A and X 1C connects to Y 3A. In like manner leads X 2A–C connect to the B terminals of Y 1–3 and the X 3A–C connect to the C leads of Y 1–3. The gate further includes a SUM subcircuit 510 having a multivalued output terminal 511 for providing an output S having vaues 0–3. Subcircuit 510 has a first bus input having three leads connected to the sequential leads A–C of Y 1 respectively. An additional bus has leads connected to the Y 2 leads and the Y 3 leads respectively. An additional subcircuit 514 provides a carry output (C) at terminal 516 and is responsive to four input leads, the first connected to the Y 2C, the second connected to the Y 2B, the third connected to the Y 3B and the fourth connected to the Y 3C input leads.

Referring to FIG. 7C, two of the individual subcircuits 504 for the X logic levels and 510 for the Y logic levels are shown. Moreover, the SUM subcircuit 510 is shown comprising an array of nine input gates. Further the C subcircuit 514 has been generally included in the gating circuitry by utilizing additional collectors on gate input transistors 5, 6 and 8, 9. Combining the C circuitry results in considerable saving in circuit area and as will be seen is readily incorporated by the inclusion of additional collector regions in the above mentioned input gate transistors. Although not shown, the previously described FIG. 7B busses interconnect the respective X and Y subcircuits to the SUM and carry subcircuits 510 and 514. For purposes of illustration only two lines will be connected as those being energized for two situations, the first being a level of two at the X input and a level of three at the Y input. In the second situation the input logic levels will be reversed, the matrix interconnect readjusted, and the same output provided to show that the product (3·2) = (2·3). A three level at the terminal 506 and a two level at the 502 terminal will uniquely select input S 3A.

Turning then to operation of the S 3A connection, two units of current will be sinked from S 3A to common, the input gate transistor will sink two units of current from the current source connected to node H, and the resulting one unit will be mirrored to sink one unit of the three unit current source driving the output terminal 511 with the result being an S output of two units. Thus, it is clear that the product of the input levels may be expressed as: $X \cdot Y = S + 2^2 C$, with further combinations being shown in the table FIG. 7D.

Referring to FIG. 8A, an INVERSION (INV) gate is shown to complete a minimum modular logic system. For a given input, an inverse function is provided such that the product $X \cdot X^{-1} = 1 \cdot \text{Mod } N$. Referring specifically to FIG. 8B, the INV inversion circuit is shown. For purposes of illustration N will be shown for a value of five as the solutions for other smaller valued N solutions would be trivial. The circuit includes an input transistor 530 having a base connected to the input 532 and having plural collectors 533, 535, 537, 539, 542 and 544. A common base region 546 is provided and has a connection to collector 533. A common emitter region 548 is provided. Collector 535 is connected to the base of a transistor 550 which is also connected to 1.5 unit current source. The collector transistor 550 is connected to the base of transistor 552 and is further connected to a one unit current source. The base of transistor 552 is connected to a first collector of the device and a second collector is connected to a four unit current source. The second collector and collector 542 of the input device are connected to the base input of transistor 556 having a first collector feedback connection to the base of said transistor and a second collector connected to the output terminal 558. A four unit current source is connected to output terminal 558. As will be noted the current sources are all connected to a common voltage supply means and the emitters of the respective transistors to a common region or common terminal.

Collector 537 of transistor 530 is connected to a 2.5 unit current source and to the base of transistor 560. Transistor 560 has a first collector connected to a one unit current source and also to the base input of transistor 564. Collector transistor 564 is connected to the base of transistor 552. The second collector of transistor 560 is connected to an additional one unit current source and to the base input of transistor 568 having two collectors, the first of which is connected to the base, and the second connected to the output terminal 558. Referring once again to the transistor 530, collector 539 is connected to a 3.5 unit current source and to the base of transistor 570. Collector of transistor 570 is connected to a one unit current source and to the base of transistor 573 which has a collector connected to the base of transistor 568. Collector 544 of transistor 530 is connected to a 0.5 unit current source and to the base of transistor 577 having a collector connected to the base of transistor 579 and to a one unit current source. Transistor 579 has a one unit current source connected thereto and is connected to the no inverse (NI) output terminal.

Referring then to the table FIG. 8C, the operation of the inverse gate may now be described. For purposes of understanding it should be noted that the lower transistor 577, 579 and associated circuitry provide the zero detector function. If the zero input value at terminal 532 is disallowed by an indication of no inverse, NI, then it can be seen from the table of FIG. 8C that the inverse $X^{-1}$ replicates the input X for values of zero, one, and four. In operation this is attained by the mirror current of transistor 556 when transistors 552 and 568 are cut off. For $X = 2$ only the mirror current of transistor 552 is activated by virtue of threshold detectors 550, 560 and 564. The net effect is to add one unit of current to the output which is replicating the input value of two units. Thus, for this situation $X^{-1} = 3$, for $X = 2$.

For $X = 3$ only the mirror transistor 568 is activated by detectors 560, 570 and 573 causing one unit of current to be subtracted from the output. Thus, $X^{-1} = 2$, for $X = 3$.

Thus, it is apparent that there has been provided both Post logic and modular logic, multivalued injection gate circuitry. The circuitry is improved over known functional circuits which singly, or as a group, perform logic operations. In particular, it is apparent that the present invention provides multilevel logic circuit elements which may be used singly or combined in circuit arrays having greatly reduced semiconductor area.

We claim:
1. A multivalue logic circuit for providing predetermined logic outputs in response to logical combinations of inputs having at least three logic levels comprising,
   a plurality of input devices for receiving logic inputs each having at least three logic levels and capable of assuming conduction states in response to said at least three logic levels of said inputs,
   at least one output device connected to two or more of said input devices, and
   means for providing predetermined logic levels intermediate said input and output devices for controlling the conduction state of the output devices as a function of the conduction state of the input devices responding to said at least three logic levels and as a function of the predetermined logic levels.

2. A multivalue logic circuit for providing predetermined logic outputs in response to logical combinations of inputs having at least three logic levels comprising,
   a plurality of input transistors, each input transistor having an input base, an input collector and an input emitter, each input transistor connected at the input base to receive one of said inputs, each input having at least three logic levels for controlling the input collector to emitter conduction state in response to said at least three logical levels of said one of said inputs,
   one or more output transistors, each output transistor having an output base, an output collector and an output emitter, each output transistor having the output base connected to two or more of the input collectors, means for providing predetermined logic levels for controlling the conduction state of said output transistor as a function of the conduction state of said two or more connected input collectors responding to said at least three logic levels and as a function of said predetermined logic levels.

3. A logic circuit for providing predetermined logic outputs in response to logical combinations of inputs comprising,
a plurality of input transistors, each input transistor having an input base, an input collector and an input emitter, said input transistors each including two or more input collectors and wherein each of said input transistors includes means for connecting one of said input collectors to the input base to produce a normalized input collector current in each of said two or more input collectors, each input transistor connected at the input base to receive one of said inputs to control the input collector to emitter conduction state in response to the logical level of said one of said inputs,
one or more output transistors, each output transistor having an output base, an output collector and an output emitter, each output transistor having the output base connected to two or more of the input collectors, means for providing predetermined logic levels for controlling the conduction state of said output transistor as a function of the conduction state of said two or more connected input collectors and as a function of said predetermined logic levels.

4. The circuit of claim 3 wherein each of said input transistors includes input injection means for providing at the input base an input injection current capable of causing said input collector current to be a function of the number of input collectors of said input transistors.

5. The circuit of claim 4 wherein said output transistor includes injection means for making said output injection current equal to said input collector current.

6. The circuit of claim 5 including one or more output transistors and wherein said means includes means for making said output injection current equal to a predetermined ratio of said input collector current.

7. The circuit of claim 6 including a first one of said output transistors having means for making said output injection current equal to a first ratio S of said input collector current; including a second one of said output transistors having means for making said output injection current equal to a second ratio T of said input collector current where S and T have predetermined ratios; first connection means for connecting the base of said first one of said output transistors to one collector from each of at least S of said input transistors whereby said first one of said output transistors is OFF only when S of said input transistors are ON, second connection means for connecting the second one of said output transistors to one collector from each of at least T of said input transistors whereby said second one of said output transistors is OFF only when T of said input transistors are ON.

8. The circuit of claim 7 including means for providing ratios having S equal to one and means for making T equal to two, wherein said input transistors include first and second multiple-collector transistors, where said first connection means includes means for connecting the base of said output transistor to one collector from each of said multiple-collector transistors, where the input bases of said first and second multiple-collector transistors are X and Y, whereby the collector output from said output transistor is the logical MAX of X and Y.

9. The circuit of claim 4 including one of said input transistors having said input injection means including means for making said input collector current equal to an integral multiple of said input transistors.

10. A method for performing multilevel logic operations in a circuit having input and output devices and intermediate logic level means providing predetermined logic outputs in response to logic combinations of inputs each having at least three logic levels comprising the steps of
providing logic signals each capable of achieving at least three logic levels at said input devices,
selectively combining the outputs of said input devices with said intermediate level means and
causing said output devices to assume outputs which are a function of the ratios of said multilevel inputs and said level means to thereby perform multilevel logic operations.

11. A multivalue logic circuit for providing predetermined logic outputs in response to logical inputs having at least three logic levels comprising,
at least one input device having a plurality of outputs, said input device for receiving logic inputs each having at least three logic levels and capable of assuming conduction states in response to said at least three logic levels of said inputs,
at least one output device connected to two or more of said input device outputs, and
means for providing predetermined logic levels intermediate said input and output devices for controlling the conduction state of the output devices as a function of the conduction state of the at least one input device responding to said at least three logic levels and as a function of the predetermined logic levels.

12. A multivalue logic circuit for providing predetermined logical outputs in response to logic inputs having at least three logic levels comprising,
a unitary input device having at least one input element and a plurality of outputs, said input device for receiving logic inputs each having at least three logic levels and capable of assuming conduction states in response to the said at least three logic levels of said inputs,
at least one output device connected to two or more of said input device outputs, and
means for providing predetermined logic levels intermediate said input and output devices for controlling the conduction state of the output devices as a function of the conduction state of the input device responding to said at least three logic levels and as a function of the predetermined logic levels.

* * * * *